US010629767B2

(12) United States Patent
Singh et al.

(10) Patent No.: US 10,629,767 B2
(45) Date of Patent: Apr. 21, 2020

(54) NANO AVALANCHE PHOTODIODE ARCHITECTURE FOR PHOTON DETECTION

(71) Applicants: Narsingh B. Singh, Ellicott City, MD (US); John V. Veliadis, Hanover, MD (US); Bettina Nechay, Laurel, MD (US); Andre Berghmans, Owing Mills, MD (US); David J. Knuteson, Ellicott City, MD (US); David Kahler, Arbutus, MD (US); Brian Wagner, Baltimore, MD (US); Marc Sherwin, Catonsville, MD (US)

(72) Inventors: Narsingh B. Singh, Ellicott City, MD (US); John V. Veliadis, Hanover, MD (US); Bettina Nechay, Laurel, MD (US); Andre Berghmans, Owing Mills, MD (US); David J. Knuteson, Ellicott City, MD (US); David Kahler, Arbutus, MD (US); Brian Wagner, Baltimore, MD (US); Marc Sherwin, Catonsville, MD (US)

(73) Assignee: NORTHROP GRUMMAN SYSTEMS CORPORATION, Falls Church, VA (US)

( * ) Notice: Subject to any disclaimer, the term of this patent is extended or adjusted under 35 U.S.C. 154(b) by 0 days.

(21) Appl. No.: 16/233,705

(22) Filed: Dec. 27, 2018

(65) Prior Publication Data

US 2019/0131480 A1    May 2, 2019

Related U.S. Application Data

(62) Division of application No. 15/356,152, filed on Nov. 18, 2016, now Pat. No. 10,211,359, which is a (Continued)

(51) Int. Cl.
*H01L 31/107*    (2006.01)
*H01L 31/0336*   (2006.01)
(Continued)

(52) U.S. Cl.
CPC ...... *H01L 31/1075* (2013.01); *H01L 27/1443* (2013.01); *H01L 27/1446* (2013.01);
(Continued)

(58) Field of Classification Search
None
See application file for complete search history.

(56) References Cited

U.S. PATENT DOCUMENTS 8,390,705 B2    3/2013    Bratkovski et al.
2003/0089899 A1    5/2003    Lieber et al.
(Continued)

*Primary Examiner* — Long Pham
(74) *Attorney, Agent, or Firm* — Tarolli, Sundheim, Covell & Tummino LLP

(57) ABSTRACT

An integrated circuit includes a substrate material that includes an epitaxial layer, wherein the substrate material and the epitaxial layer form a first semiconductor material with the epitaxial layer having a first conductivity type. At least one nanowire comprising a second semiconductor material having a second conductivity type doped differently than the first conductivity type of the first semiconductor material forms a junction crossing region with the first semiconductor material. The nanowire and the first semiconductor material form an avalanche photodiode (APD) in the junction crossing region to enable single photon detection. In an alternative configuration, the APD is formed as a p-i-n crossing region where n represents an n-type material, i represents an intrinsic layer, and p represents a p-type material.

9 Claims, 10 Drawing Sheets

Related U.S. Application Data division of application No. 14/185,567, filed on Feb. 20, 2014, now Pat. No. 9,570,646.

(51) Int. Cl.
*H01L 31/0232* (2014.01)
*H01L 27/144* (2006.01)
*H01L 31/18* (2006.01)
*H01L 31/0352* (2006.01)

(52) U.S. Cl.
CPC .... *H01L 31/02327* (2013.01); *H01L 31/0336* (2013.01); *H01L 31/035227* (2013.01); *H01L 31/18* (2013.01)

(56) References Cited

U.S. PATENT DOCUMENTS

| | | |
|---|---|---|
| 2010/0290217 A1 | 11/2010 | Anantram et al. |
| 2011/0180894 A1 | 7/2011 | Samuelson et al. |
| 2014/0113828 A1* | 4/2014 | Gilbert ............... G01R 33/0354 505/100 |

* cited by examiner

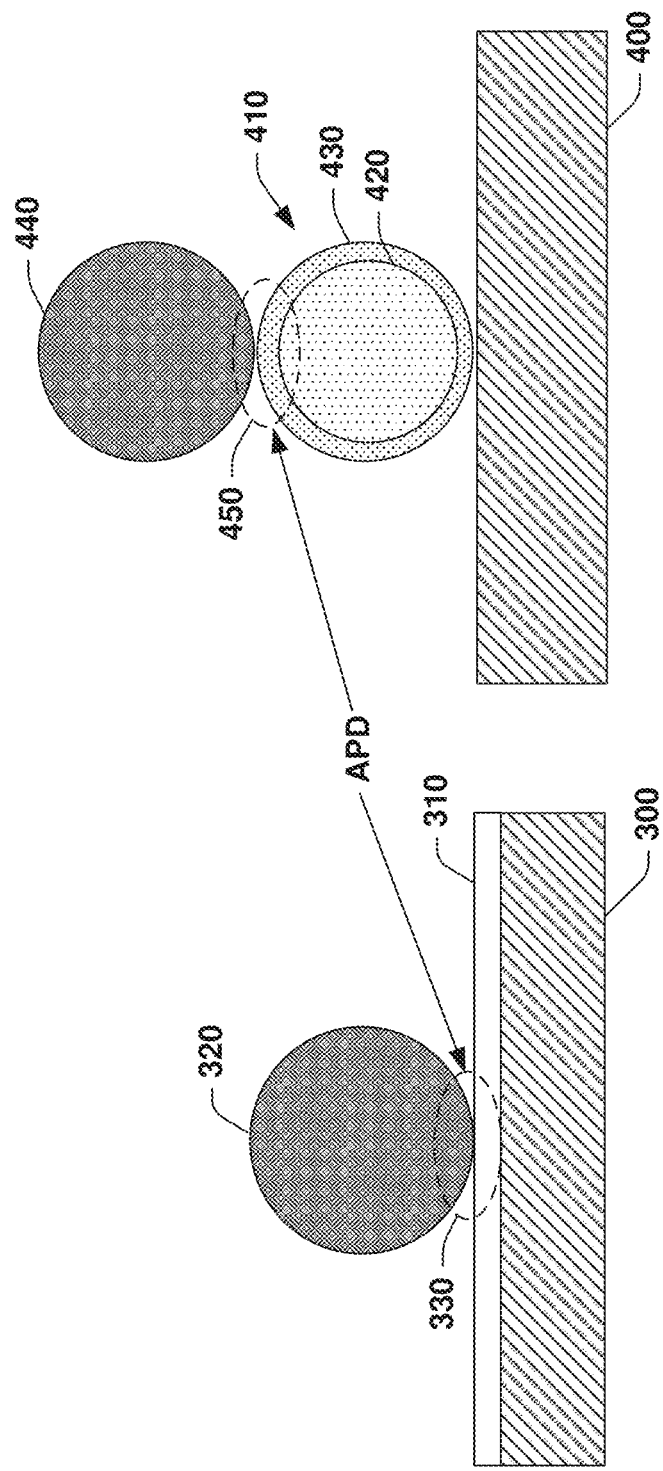

NANO AVALANCHE PHOTODIODE ARCHITECTURE FOR PHOTON DETECTION

RELATED APPLICATIONS

This application is a divisional application of U.S. patent application Ser. No. 15/356,152, filed 18 Nov. 2016, which is a divisional application of U.S. patent application Ser. No. 14/185,567, filed 20 Feb. 2014, now U.S. Pat. No. 9,570,646, issued on 14 Feb. 2017, both of which are incorporated herein in their entirety.

TECHNICAL FIELD

This disclosure relates to semiconductor detectors, and more particularly to detectors that employ nanowire configurations for photon detection.

BACKGROUND

There is a need for sensitive detectors that can detect photon energy even in low-light conditions. Various applications utilize such detectors for low light imaging, laser communications applications, and applications such as LADAR where coherent lasers are employed instead of radio waves as in conventional RADAR. The carrier frequency of 1 um LADAR is about $3\times10^{14}$ Hz, for example, and can provide about a 100,000 times improvement in spatial resolution over 1 GHz RADAR, for example. The promise of great improvement in spatial resolution has given impetus to the development of various LADAR applications. In addition to LADAR, other imaging applications also require detectors for very low light conditions.

In very low light applications, internal detector gain is required to boost the received photon signal above the noise floor of subsequent electronics and signal processing. For many years, the only device that provided such gain was the photomultiplier tube (PMT) based on vacuum tube technology. While offering high gain, the PMT has a number of practical limitations. Such limitations included dealing with a bulky vacuum tube, offering limited linearity, providing a narrow spectral response range, and providing a low quantum efficiency (QE) (typically <25%). The PMT also generates heat, requires several thousand volts for operation, and is not well suited for integration into system on chip (SOC) platforms. Also, long detector readout times are not optimal for fluorescent lifetime measurement. Various solid-state alternatives require several hundred volts for operation and have process limitations that are not compatible with standard semiconductor processing and integrated electronics.

SUMMARY

This disclosure relates to integrated circuit photon detectors that are created at nanowire crossing regions. In one aspect, an integrated circuit includes a substrate material that includes an epitaxial layer, wherein the substrate material and the epitaxial layer form a first semiconductor material with the epitaxial layer having a first conductivity type. The substrate can be intrinsic or of the first conductivity type of the epitaxial layer. At least one nanowire comprising a second semiconductor material having a second conductivity type that is different than the first conductivity type of the epitaxial layer of the first semiconductor material forms a junction crossing region with the first semiconductor material. The nanowire and the first semiconductor material form an avalanche photodiode (APD) in the junction crossing region to enable single photon detection.

In another aspect, an integrated circuit includes a first nanowire comprising a first semiconductor material having a first conductivity type. The first nanowire has an intrinsic layer formed over the first semiconductor material to increase photon sensitivity. A second nanowire comprising a second semiconductor material having a second conductivity type different than that of the first conductivity type of the first semiconductor material of the first nanowire forms a junction crossing region with the first nanowire. The first nanowire and the second nanowire form an avalanche photodiode (APD) in the junction crossing region to enable single photon detection. A substrate material provides a base for the junction crossing region formed by the first nanowire and the second nanowire.

In yet another aspect, a method of forming an integrated circuit is provided. The method includes forming a substrate material and forming an epitaxial layer on the substrate material. The substrate material and the epitaxial layer form a first semiconductor material with the epitaxial layer having a first conductivity type. The substrate can be intrinsic or of the first conductivity type of the epitaxial layer. The method includes forming at least one nanowire on the epitaxial layer. The nanowire comprises a second semiconductor material having a second conductivity type that is different than the first conductivity type of the epitaxial layer of the first semiconductor material and forms a junction crossing region with the first semiconductor material. The nanowire and the first semiconductor material form an avalanche photodiode (APD) in the junction crossing region to enable single photon detection.

In still yet another aspect, a method of forming an integrated circuit includes forming a substrate material to provide a base for a junction crossing region for an avalanche photodiode (APD). The method includes forming a first nanowire on the substrate material, where the first nanowire comprises a first semiconductor material having a first conductivity type. The method includes forming an intrinsic layer over the first semiconductor material to increase photon sensitivity. The method includes forming a second nanowire over the intrinsic layer, the second nanowire comprising a second semiconductor material having a second conductivity type that is different than that of the first conductivity type of the first semiconductor material of the first nanowire. The method includes forming a junction crossing region with the first nanowire and the intrinsic layer. The first nanowire, the intrinsic layer, and the second nanowire form an avalanche photodiode (APD) in the junction crossing region to enable single photon detection.

BRIEF DESCRIPTION OF THE DRAWINGS

FIGS. 3 and 4 illustrate alternative examples of integrated circuit configurations that form an avalanche photodiode (APD) at nanowire crossing points for detecting photons at various wavelengths.

DETAILED DESCRIPTION

This disclosure relates to nanowire avalanche photodiode (or nano-APD) configurations employed as photon detectors that support various applications. The nano-APD's can operate in very low-light conditions (e.g., single photon detection) with improved bandwidth while mitigating effects such as high dark currents that limit the performance of conventional detector configurations. The nano-APD can be constructed via semiconductor processing by crossing a semiconductor nanowire of one conductivity type (e.g., n-type conductivity) over a semiconductor nanowire of a different conductivity type (e.g., p-type conductivity) to form PN junctions. At the junctions of the nanowire crossing points of the materials, signal amplification can be achieved via the formation of avalanche photodiodes that can detect received photon energy. By forming a plurality of such crossing points in a given area on a semiconductor substrate, a pixel can be formed from the respective crossing points where each crossing point inside the pixel can potentially receive and detect photon energy. Having multiple crossing points inside of the pixel increases the sensitivity of the pixel detector and further improves signal-to-noise performance over conventional configurations. A plurality of such pixels can be formed on a semiconductor substrate providing an integrated circuit photon detector array, for example.

By utilizing crossed nanowires to create the avalanche photodiodes for the detector, other performance gains can be achieved. For example, nanowires provide reduced resistance and capacitance over conventional substrate signal paths. As such, reduced RC time constants can be achieved that enable a reduction in recovery time for passive quenching and in gated length for gated passive quenching which in turn lead to an increase in detector bandwidth and a minimization of dark count rate (DCR). The nano-APD configurations can be formed utilizing different materials that are tailored to the wavelength of the radiation to be detected. For example, one set of nanowire materials may be selected for detecting infrared (IR) radiation and another set of nanowire materials may be chosen for detecting short wavelength IR (SWIR) radiation, medium wavelength IR (MWIR) radiation, long wavelength IR (LWIR) radiation, and so forth. Such material selection enables further signal performance gains for a given imaging application.

Figure 1:
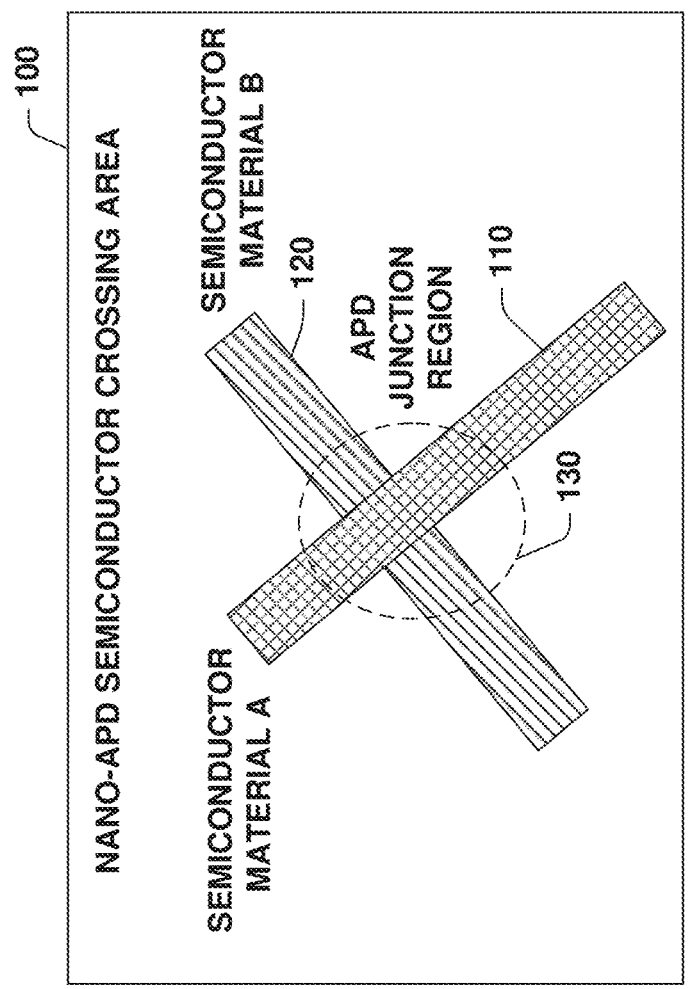
FIG. 1 illustrates an example of a nanowire configuration that forms an avalanche photodiode (APD) at nanowire crossing points for detecting photons at various wavelengths.

FIG. 1 illustrates an example of a nanowire configuration that forms an avalanche photodiode (APD) at nanowire crossing points for detecting photons at various wavelengths. An example region of a semiconductor is shown as a nano-APD crossing area 100 where a semiconductor 110 of a first material (A) having a first conductivity type (e.g., n-type or p-type) crosses over a semiconductor 120 fabricated of a second material (B) having a second conductivity type that is different than that of the first material (e.g., n-type or p-type different than that of the first material). At the junction of the crossing point of semiconductors 110 and 120, an avalanche photodiode (APD) PN junction region 130 is formed where light amplification can occur to detect light at various wavelengths depending on the materials selected for the respective semiconductors. In one example, the first and second semiconductor material 110 and 120 can be crossed nanowire structures. At the APD junction region 130, single photon detection can be achieved since increased sensitivity is provided by the nano-scale crossing points. Moreover, in an alternative configuration, nanowires can be grown or placed directly over an epitaxial layer formed on a substrate to also improve sensitivity and enable single-photon detection.

In some cases, the p-type material can form the bottom nanowire and the n-type material can form the top nanowire. In other cases, the semiconductor types can be reversed (e.g., p-type formed on top and n-type formed on bottom). In yet another example, rather than one of the materials being a nanowire, the crossing point and junction region 130 can be formed by the intersection of a nanowire and a substrate material having an epitaxial layer formed thereon. For example, if the material 120 were formed as a substrate material having an epitaxial layer, the APD junction 130 could be formed when the material 110 was deposited on top of the substrate 120 as a nanowire. In still yet another example, an intrinsic layer can be grown between the n-type and p-type materials to further improve sensitivity. For illustrative purposes, a single APD junction is described however a plurality of such junctions can be formed in a given area. As will be described and illustrated below, a plurality of APD junctions can be configured in a given unit area to form a pixel for detecting photons. A plurality of pixels can be fabricated to form a semiconductor detector for detecting photons.

The electrical transport and optical properties of nanowires are such that nano-APDs can be fabricated to achieve high sensitivity, single photon detection, and sub-wavelength resolution, for example. This can include crossed nanowire array-based nano-APDs which can reduce inter-pixel cross talk. The semiconductor materials can be fabricated by physical vapor deposition (PVD) and/or chemical vapor deposition (CVD) methods such as used for Ge, CdSe and other materials systems which are described below. The growth and control of the desired nanowire size and orientation can be accomplished by adjusting substrate temperature, fluid flow (nutrients) and the step growth process, for example. This process enables the fabrication of nanowires ranging from 2-100 nm in diameter and 5 to 250 nm in length, for example. Very high amplification in crossed nanowire structures can be achieved by employment of different APD configurations and then optimization of performance by utilizing resonant cavity enhanced APD structures, for example. In one specific example application, APD configurations allow for the realization of an advanced Laser RADAR (LADAR)-Radio Frequency Power Amplifier (RFPA). The APD configurations can include: APD detector arrays fabricated in nanowires and operating in the Geiger mode; APD bias and operating circuits with positive feedback; and multilevel digital logic for minimizing detector pixel size, for example. The LADAR-RFPA can be a hybrid APD detector array made of Ge, CdS or InGaAs nanowires, for example. The APD configurations can be readout hybridized with a pixel readout circuit fabricated in silicon, for example.

The detection of single photons of light via the APD PN junctions 130 can enable a wide range of emerging applications including communications, imaging with significant spatial resolution, quantum cryptography and single molecule fluorescence, for example. The nano-APDs based on at least one of the crossing materials being a nanowire can enable single photon detection with high spatial resolution, high multiplication gain, and bandwidth. Alternative configurations will be illustrated and described below based on nanowires involving integration of nanophotonics with nanoelectronics with application areas ranging from communications and computing to enhanced diagnostics.

As will be illustrated and described below, various integrated circuit configurations and material selections can be provided to enhance photon detection along with enabling tuning for reception of photons at various wavelengths. A first integrated circuit configuration (e.g., See FIG. 3) includes a substrate material (e.g., material 120) that includes an epitaxial layer, wherein the substrate material and the epitaxial layer form a first semiconductor material, and wherein the epitaxial layer has a first conductivity type. The substrate can be intrinsic or of the first conductivity type of the epitaxial layer. At least one nanowire (e.g., material 110) includes a second semiconductor material having a second conductivity type doped differently than the first conductivity type of the epitaxial layer of the first semiconductor material and forms the junction crossing region 130 with the first semiconductor material. The nanowire and the first semiconductor material form an avalanche photodiode (APD) in the PN junction crossing region 130 to enable single photon detection.

In a second integrated circuit configuration (e.g., See FIG. 4), a first nanowire (e.g., layer 120) includes a first semiconductor material having a first conductivity type. The first nanowire includes an intrinsic layer formed over the first semiconductor material to increase photon sensitivity. As used herein, the term intrinsic layer refers to a non-intentionally doped or an un-doped layer that is not associated with a conductivity type such as n-type or p-type. A second nanowire (e.g., material 110), that includes a second semiconductor material having a second conductivity type doped differently than the first conductivity type of the first semiconductor material of the first nanowire, forms a p-i-n junction crossing region 130 with the first nanowire. The crossing of the first nanowire and the second nanowire form an avalanche photodiode (APD) in the p-i-n junction crossing region to enable single photon detection. A substrate material (See FIG. 4) provides a base for the junction crossing region formed by the first nanowire and the second nanowire.

The first conductivity type can be a p-type and the second conductivity type can be an n-type or the first conductivity type can be an n-type and the second conductivity type can be a p-type, for example. In the first configuration, the nanowire is grown on the epitaxial layer via deposition or grown at a different location than the epitaxial layer and placed on the epitaxial layer after growth. In the second configuration, nanowires can be grown or placed on the substrate and grown and/or placed to create the junction crossing regions 130. A Bragg mirror (See FIGS. 5 and 6) can be formed over the substrate and below the epitaxial layer to increase photon detection sensitivity of the APD. At least one of the first semiconductor material or the second semiconductor material can be Si to enable pixel readout of the APD. In another example, the APD forms a resonant cavity to increase photon detection sensitivity of the APD. A plurality of nanowires can form a plurality of junction crossing regions 130 in a given area on the epitaxial layer or substrate layer (See FIG. 12A), where the respective junction crossing regions form an integrated circuit pixel for photon detection. A plurality of integrated circuit pixels can be formed on the epitaxial layer or substrate layer to form a pixilated sensor array for photon detection (See FIG. 12B). As noted above, the nanowires can be fabricated at about 2 to 100 nanometers in diameter and 5 to 250 nanometers in length.

Various material selections can be made to increase APD sensitivity and adjust the wavelengths for APD detection. In one example, at least one of the first or second semiconductor materials 110 or 120 is Silicon (Si) and at least one of the first or second semiconductor materials is selected from a group consisting of: (Ge), (InGaAs), (InGaAs$_x$P$_{1-x}$), (CdS), (CdSe), (ZnS), and (ZnSe) to enable photon detection in the near infrared wavelength, where x is a number greater than zero and less than or equal to one (including fractions) and where (Ge) is Germanium, (In) is Indium, (Ga) is Gallium, (As) is Arsenic, (P) is Phosphorus, (Cd) is Cadmium, (Se) is Selenium, (Zn) is Zinc, and (S) is Sulfur. In another example, at least one of the first or second semiconductor materials 110 or 120 is Si and at least one of the first or second semiconductor materials is selected from a group consisting of: PbS, PbSe, InSb, GaSb, CdS, CdSe, HgCdSe, HgCdS, and HgCdTe to enable photon detection in the medium or long infrared wavelength, where (Pb) is Lead, (Sb) is Antimony, (Hg) is Mercury, and (Te) is Tellurium. In yet another example, at least one of the first or second semiconductor materials 110 or 120 is Si and at least one of the first or second semiconductor materials is selected from a group consisting of: PbSe$_x$Si$_{1-x}$, Cd$_x$Hg$_{1-x}$S, Pb$_x$Hg$_{1-x}$S, CdSe$_x$S$_{1-x}$, As2SxSe5-x, GeSe$_x$S$_y$Te$_{(1-x-y)}$, CuAlS$_{2-x}$Se$_x$, As$_x$Se$_{1-x}$Ge$_5$, AgGaGe$_2$—GeSe$_2$, and AgGaS$_2$—GeS$_2$ to enable tunable wavelength characteristics, wherein x and y are numbers greater or equal to zero and less than or equal to one (including fractions) and where (Cu) is Copper, (Al) is Aluminum, and (Ag) is Gold. Silicon can be intrinsic or doped for example with elements including Boron (B), Arsenic (As), Gallium (Ga), or other suitable silicon dopant.

Figure 2:
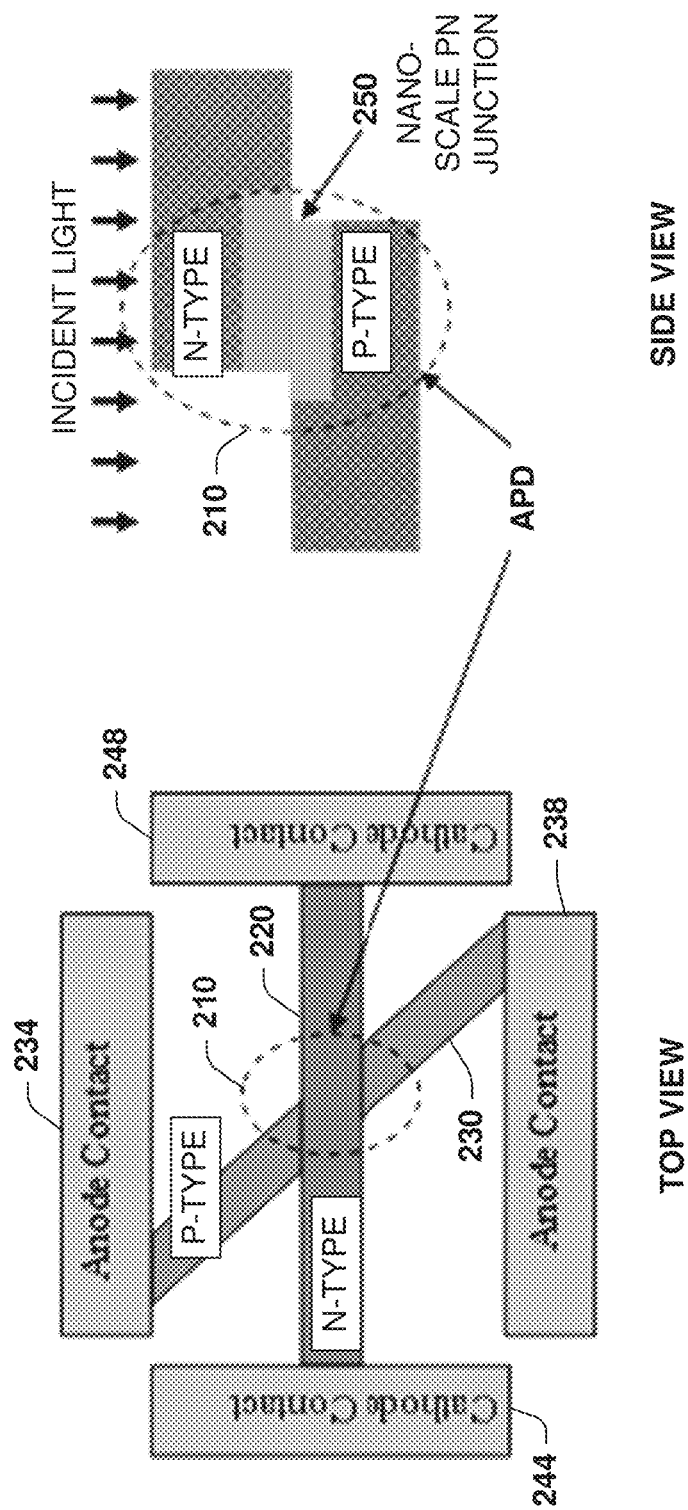
FIG. 2 illustrates an example of a crossing region for an avalanche photodiode (APD) from a top view and a side view.

FIG. 2 illustrates an example of a crossing region for an avalanche photodiode (APD) from a top view and a side view. Referring to the top view, a crossing region 210 shows the intersection of an n-type material 220 on top and a p-type material 230 on the bottom. The p-type material 230 is connected to anode contacts 234 and 238 while the n-type material is connected to cathode contacts 244 and 248. As noted above, in other configurations, the p-type material could be on the top and the n-type material could be on the bottom. The side view shows incident light propagating in the crossing region 210, wherein the intersection of the n-type and p-type materials form a nano-scale APD as shown at 250. The light is primarily absorbed in the n-type semiconductor in this example, while avalanche multiplication takes place in the nano-scale p-n junction 250. The growth techniques described herein do not require the two semiconductor materials to be lattice matched. By choosing the materials systems described herein, several designs for near IR, MWIR and LWIR can be achieved. For example, nano-APD structures can be fabricated for the 1.0 to 1.6 um wavelength range.

The nanowires can be fabricated via deposition techniques where nanometer beads are deposited that form the cylindrical shapes of the wires. The larger the bead, the greater the diameter of the nanowire. Length of the nanowire can be controlled by moving the deposition dispenser for a given distance. Nanowires can be grown directly on the substrates and/or epitaxial layers described herein or they can alternatively be grown at a different location and placed on a substrate, epi-layer, or over top of another nanowire via nano-scale placement equipment. Any suitable technique for depositing nanowires or epitaxial layers can be employed such as metal organic chemical vapor deposition (MOVCD), molecular beam epitaxy (MBE) or other suitable deposition techniques.

FIGS. 3 and 4 illustrate alternative examples of integrated circuit configurations that form an avalanche photodiode (APD) at nanowire crossing points for detecting photons at various wavelengths. FIG. 3 shows a substrate material 300 having an epitaxial layer 310 formed thereon. Epitaxy refers to the deposition of an over layer 310 on a crystalline substrate 300. Epitaxial films may be grown from gaseous or liquid precursors. Since the substrate 300 acts as a seed crystal, the deposited film may lock into one or more crystallographic orientations with respect to the substrate crystal. A nanowire 320 is deposited (or placed) on to the epitaxial layer 310, wherein an avalanche photodiode is formed at crossing region 330.

FIG. 4 shows an alternative configuration where a substrate material 400 forms a base for a crossed nanowire configuration. A bottom nanowire at 410 is formed having an inner core 420 of one conductivity type (n or p-type) and having an outer shell 430 formed as an intrinsic layer where the outer shell is not intentionally doped to produce either an n-type or a p-type material. The intrinsic layer can increase the sensitivity of the resultant crossing junction. As the inner core 420 is being deposited, the doping process supplying the inner core can be terminated while the overall deposition process for the nanowire 410 continues leaving an intrinsic layer at the outer shell 430. A nanowire 440 of a second conductivity type (e.g., n-type or p-type) doped differently than the inner core 420 can be deposited or placed over the nanowire 410 to form an APD crossing junction 450.

Figure 6:
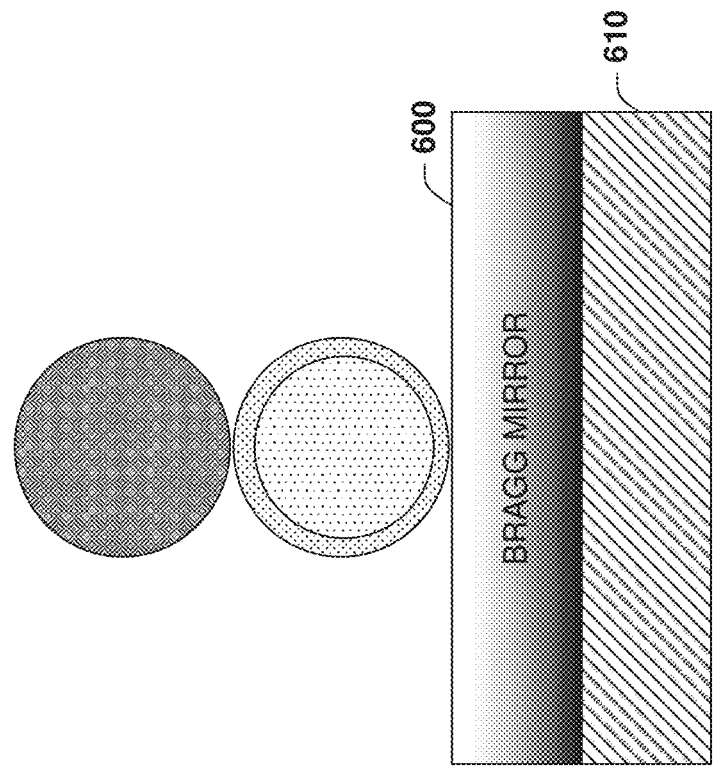
FIGS. 5 and 6 illustrate alternative examples of integrated circuit configurations that form an avalanche photodiode (APD) at nanowire crossing points for detecting photons at various wavelengths where Bragg mirrors are employed to increase detector sensitivity.
Figure 5:
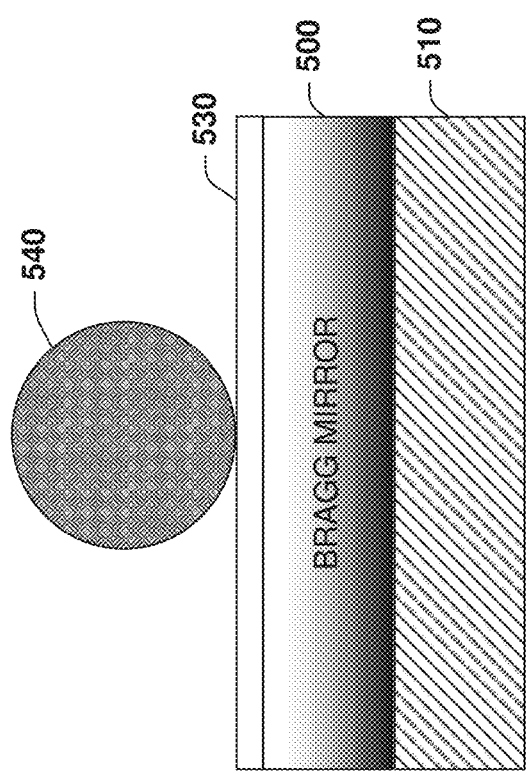

FIGS. 5 and 6 illustrate alternative examples of integrated circuit configurations that form an avalanche photodiode (APD) at nanowire crossing points for detecting photons at various wavelengths where Bragg mirrors are employed to increase detector sensitivity. In the example of FIG. 5, a Bragg mirror 500 can be deposited on top of a substrate 510 and below an epitaxial layer 530 before depositing (or placing) a nanowire 540. In the example of FIG. 6, a Bragg mirror 600 can be deposited over a substrate layer 610 and before subsequent nanowire crossing junctions are deposited and/or placed.

Figure 7:
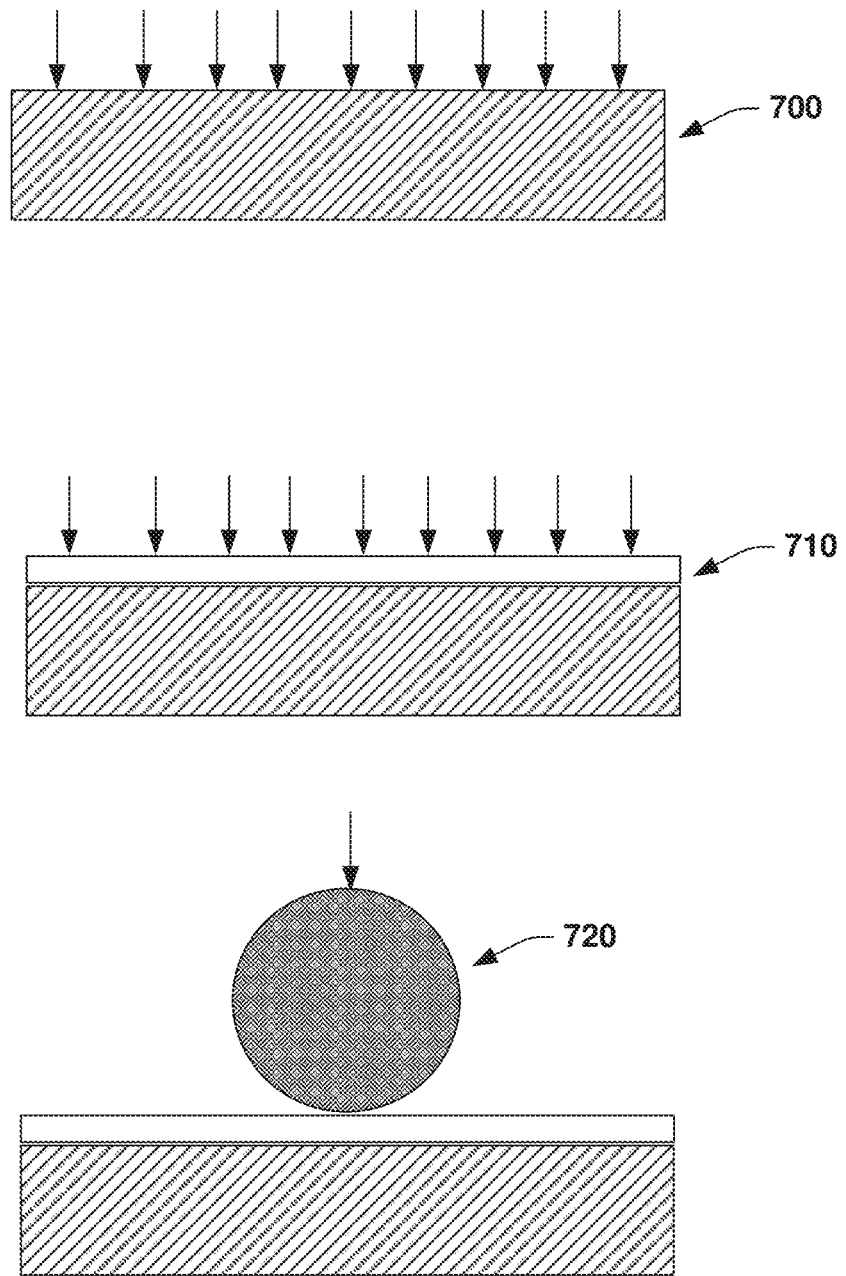
FIG. 7 illustrates a process to form the integrated circuit configuration depicted in FIG. 3.

FIG. 7 illustrates an example process to form the integrated circuit configuration depicted in FIG. 3. At 700, a substrate layer is formed via a suitable deposition method such as chemical vapor deposition, for example. The substrate is typically formed in silicon although other substrate materials are possible. At 710, the process includes forming an epitaxial layer on top of the substrate layer via a suitable deposition method. At 720, a nanowire is deposited or placed on top of the epitaxial layer. When placed, available attractive forces between the nanowire and epitaxial layer can hold the nanowire in place. A plurality of such nanowires can be deposited or placed on the epitaxial layer in a similar manner to create pixels and pixilated arrays as illustrated and described below with respect to FIG. 12. The epitaxial layer is doped as one type of conductive material (n-type or p-type) and the nanowire is doped as a different type to enable formation of the PN junction of the avalanche photodiode.

Figure 8:
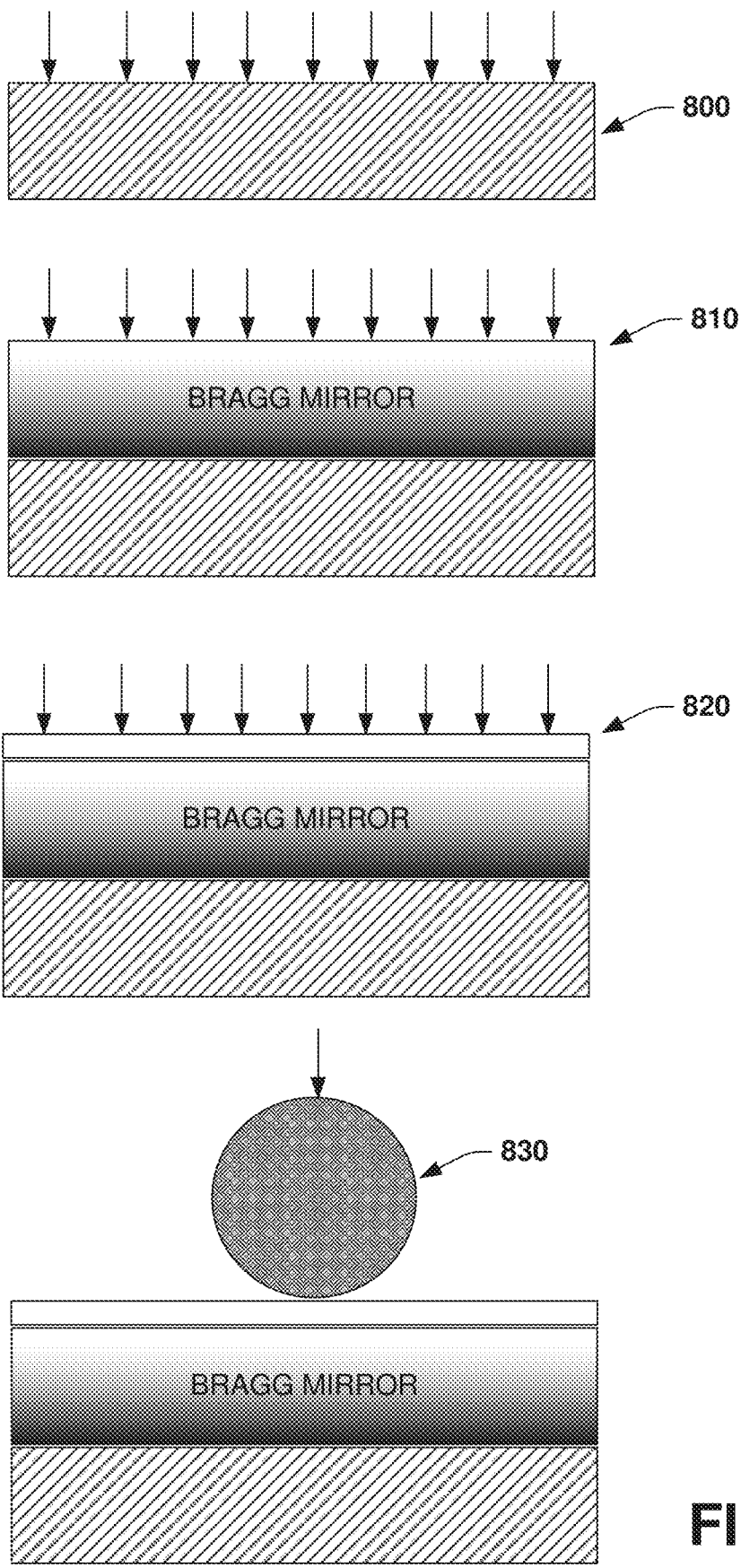
FIG. 8 illustrates a process to form the integrated circuit configuration depicted in FIG. 5.

FIG. 8 illustrates a process to form the integrated circuit configuration depicted in FIG. 5. At 800, a substrate layer is formed via a suitable deposition method such as chemical vapor deposition, for example. The substrate is typically formed in silicon although other substrate materials are possible. At 810, the process includes forming a Bragg mirror on top of the substrate layer via a suitable deposition method. This can include chemical processes to enhance the reflective surface of the mirror. At 820, an epitaxial layer is deposited over the Bragg mirror. At 830, a nanowire is deposited or placed on top of the epitaxial layer. When placed, available attractive forces between the nanowire and the epitaxial layer can hold the nanowire in place. A plurality of such nanowires can be deposited or placed on the epitaxial layer in a similar manner to create pixels and pixilated arrays as illustrated and described below with respect to FIG. 12.

Figure 9:
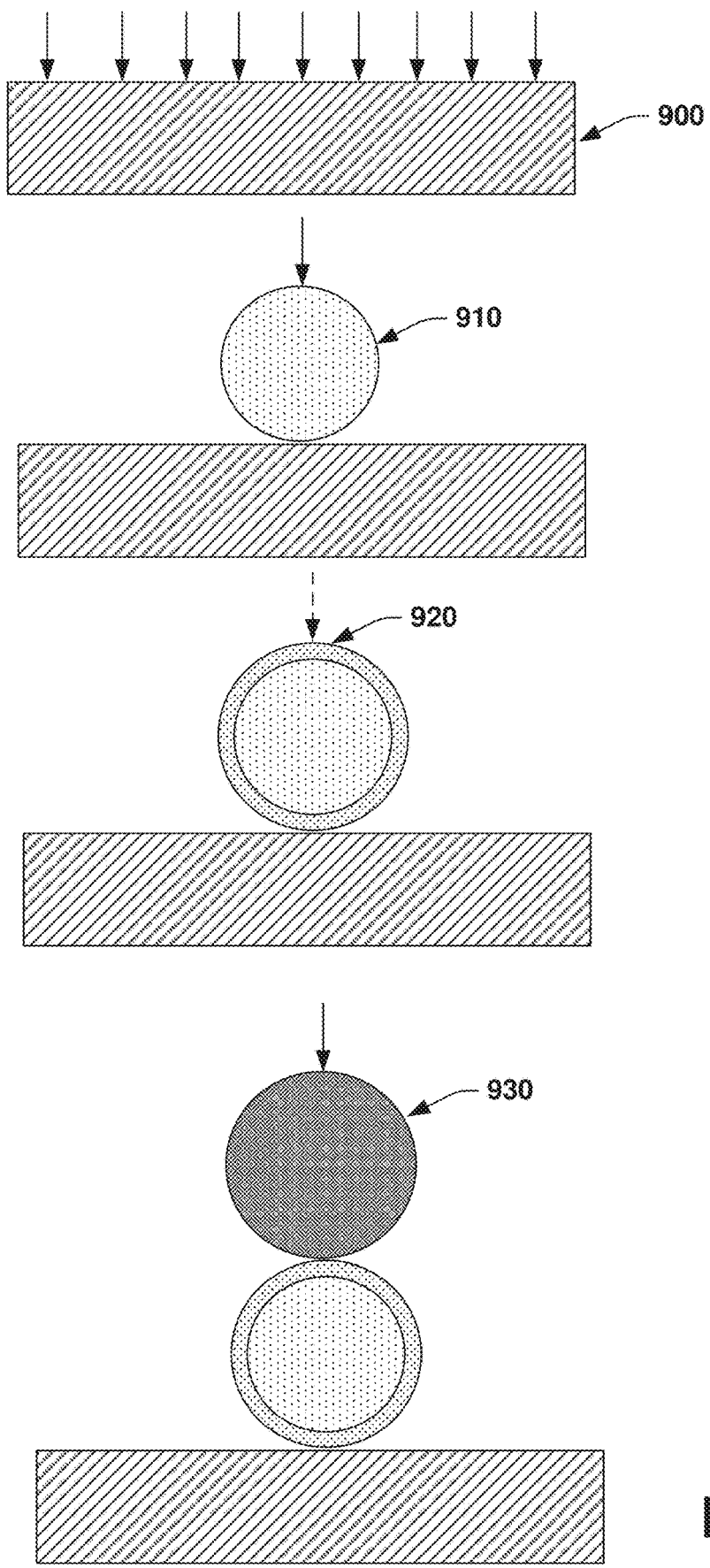
FIG. 9 illustrates a process to form the integrated circuit configuration depicted in FIG. 4.

FIG. 9 illustrates a process to form the integrated circuit configuration depicted in FIG. 4. At 900, a substrate layer is formed via a suitable deposition method such as chemical vapor deposition, for example. Before proceeding, it is noted that a Bragg mirror could alternatively be deposited on top of the substrate at this stage to increase detector sensitivity such as shown at FIG. 6. For purposes of brevity however, such Bragg mirror deposition will not be shown or described herein. At 910, a first semiconductor material having a first conductivity type is deposited as a bead having a given width and length. Before the deposition process is completed however, doping is suspended yet the deposition continues such as shown via the dotted arrow at 920. By discontinuing the doping process, a non-intentionally doped layer or intrinsic layer is formed over the first semiconductor material thus forming a nanowire having a doped inner core and an outer shell formed of an intrinsic layer. At 930, a second nanowire having a conductivity type (n-type or p-type) different than that of the inner core of the first semiconductor material is deposited or placed on top of the intrinsic layer. In this example, a nano-APD is thus formed having a p-i-n crossing junction where at least one of the materials in the junctions is p-type, at least one of the materials is n-type, and at least one of n or p-type materials is covered by an intrinsic layer.

Figure 10:
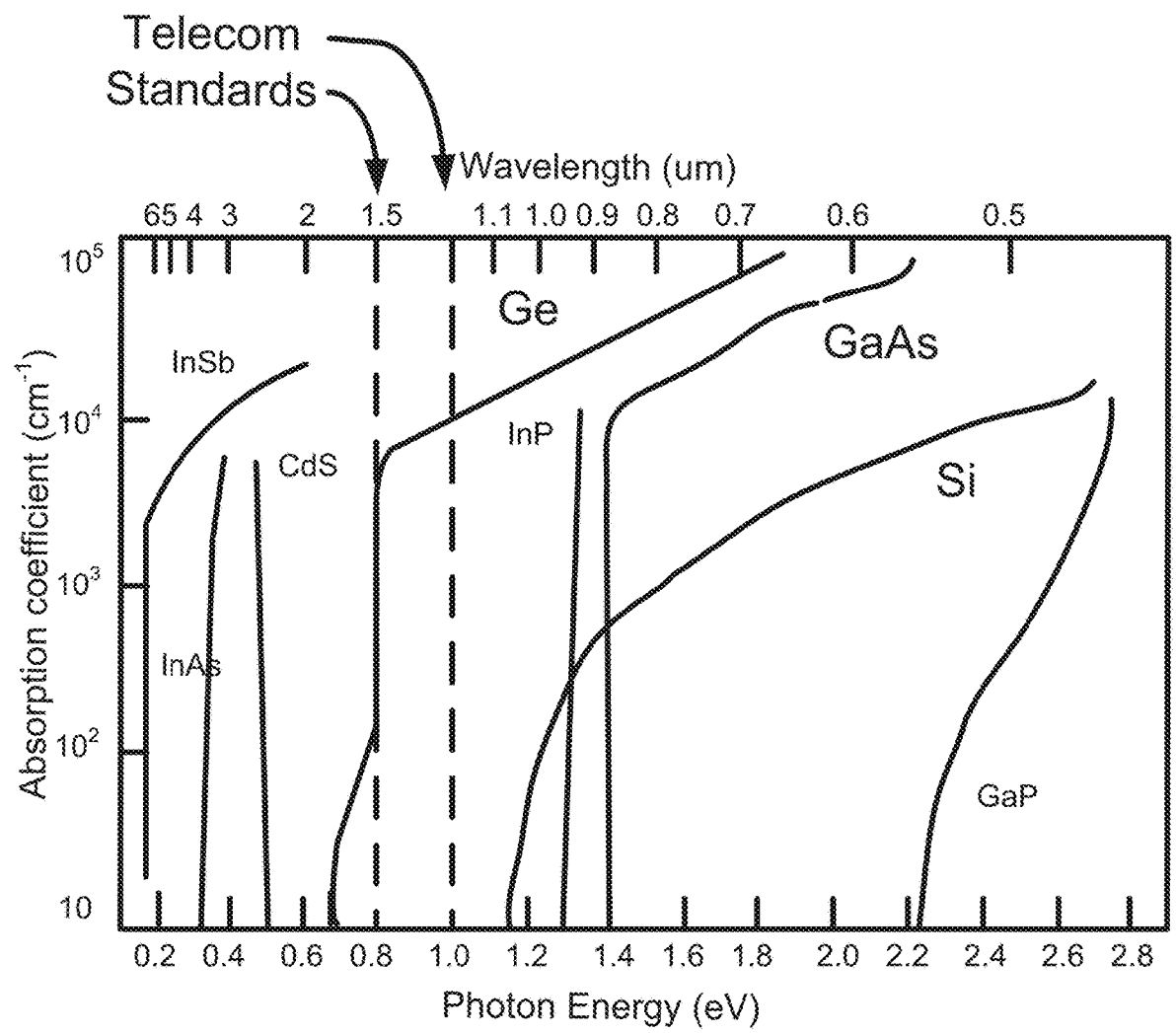
FIGS. 10 and 11 illustrate example diagrams for selecting materials to detect differing wavelengths for a crossed nanowire avalanche photodiode (APD).
Figure 11:
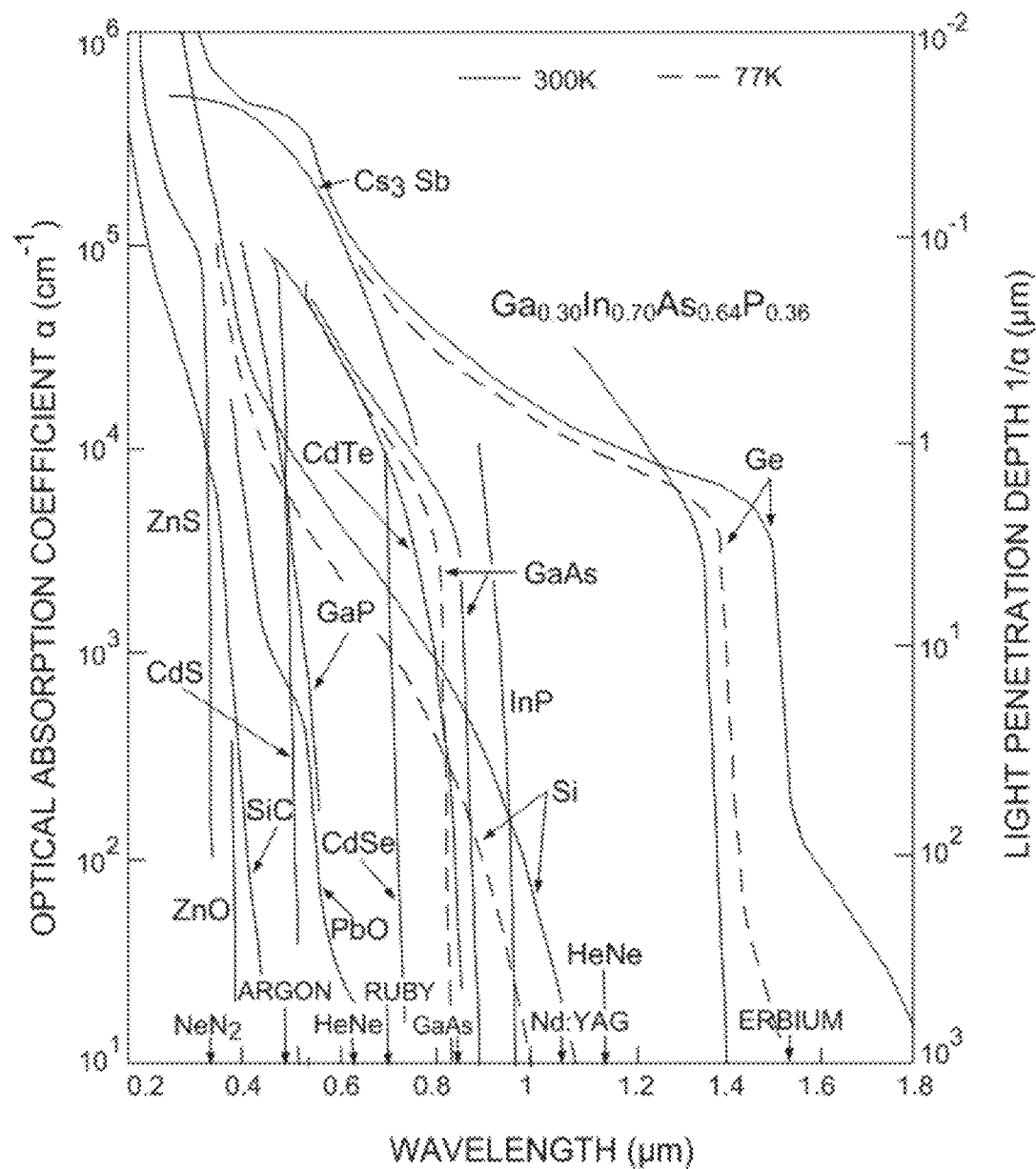

FIGS. 10 and 11 illustrate example diagrams for selecting materials to detect differing wavelengths for a crossed nanowire avalanche photodiode (APD). These diagrams illustrate design options to optimize performance and assist with achieving single photon detection. Nano-APDs scribed herein have tighter size uniformity and incorporate fewer defects due to their small size. The former allows for higher breakdown voltage uniformity (compared to micron-sized APDs), which reduces dark count rates. The fewer defects result in lower dark count rates for a nano-APD array configuration compared to those of micron-sized APD arrays. In addition, the capacitances and series resistances of nano-sized APDs are lower than their micron-sized counterparts. The small RC time constant reduces the recovery time for passive quenching and the gated length for gated passive quenching, which are useful for minimizing DRC and increasing bandwidth. The materials consideration can be based on the wavelength of interest. FIGS. 10 and 11 show exemplary band gaps and optical absorptions for several materials. The materials selection can be made for the desired wavelengths as described herein.

Figure 12:
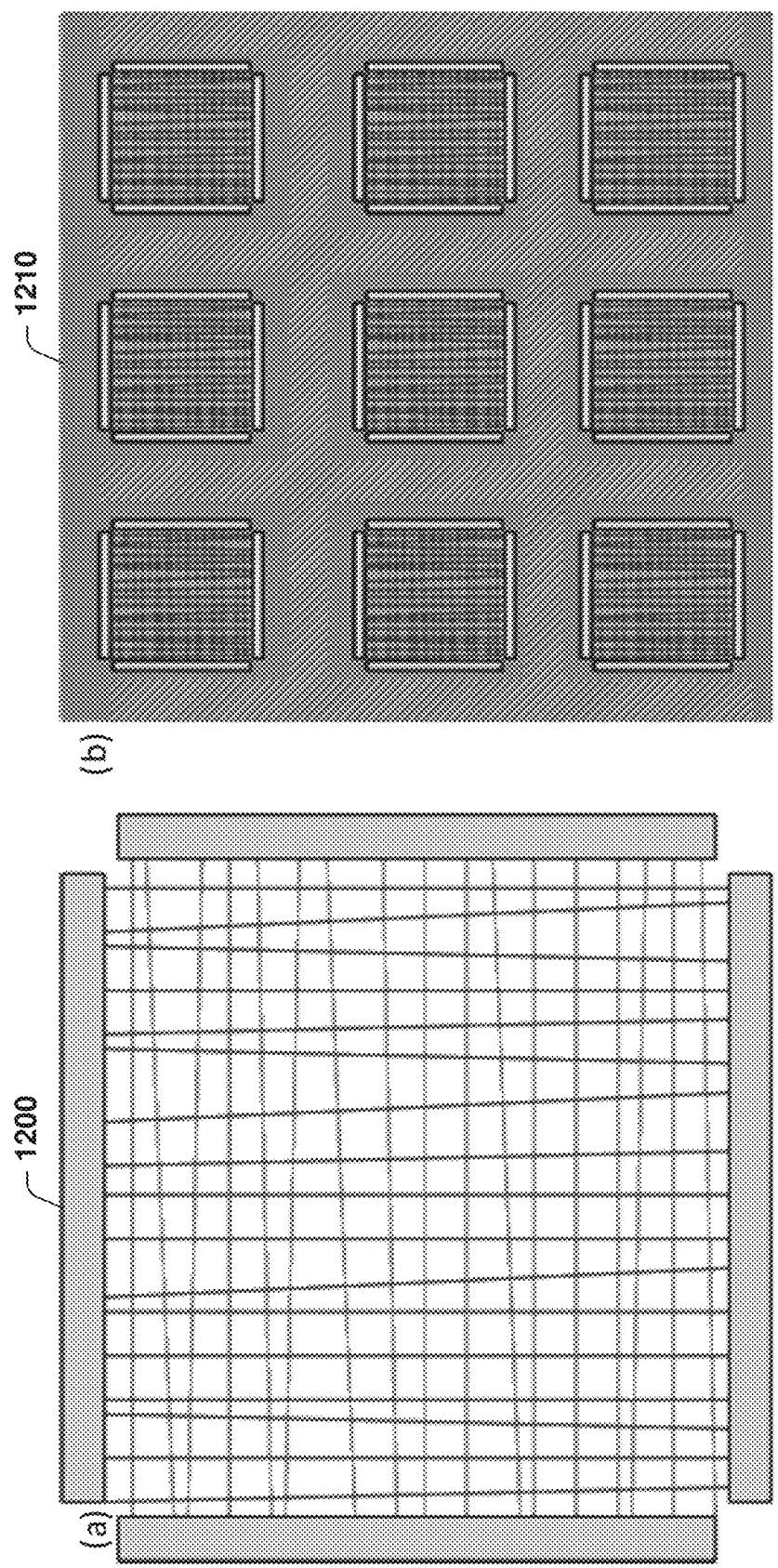
FIG. 12 illustrates an integrated circuit configuration where crossed-nanowire avalanche photodiodes (APD) are employed to construct a pixel and a pixilated sensor array.

FIG. 12 illustrates an integrated circuit configuration where crossed-nanowire avalanche photodiodes (APD) are employed to construct a pixel 12(a) and a pixilated sensor array 12(b). At 1200, an individual pixel is illustrated having a plurality of crossing junctions forming nano-APD's at each junction At 1210, a plurality of such pixels can form an integrated circuit pixilated array. To maximize sensitivity, multiple nano-APDs can be incorporated into each pixel by crossing multiple p with n nanowires (or multiple p-i-n crossings). These pixels can be about 0.1 to 50 μm in size and can include numerous individual nano-APDs. Such pixels could then be integrated into a CCD array with readout circuitry between the pixels. Alternatively, if the nanowires are grown on oxide, the readout circuitry can be below the pixels, thus optimizing the fill factor of the array.

What have been described above are examples. It is, of course, not possible to describe every conceivable combination of components or methodologies, but one of ordinary skill in the art will recognize that many further combinations and permutations are possible. Accordingly, the disclosure is intended to embrace all such alterations, modifications, and variations that fall within the scope of this application, including the appended claims. As used herein, the term "includes" means includes but not limited to, the term "including" means including but not limited to. The term "based on" means based at least in part on. Additionally, where the disclosure or claims recite "a," "an," "a first," or "another" element, or the equivalent thereof, it should be interpreted to include one or more than one such element, neither requiring nor excluding two or more such elements.

What is claimed is:

1. A method of forming an integrated circuit comprising:
forming a substrate;
forming a first nanowire comprising a first semiconductor material having a first conductivity type on the substrate;
forming an intrinsic layer over the first semiconductor material to increase photon sensitivity; and
forming a second nanowire over the intrinsic layer, wherein a portion of the second nanowire is positioned to overlay a portion of the first nanowire, the second nanowire comprising a second semiconductor material having a second conductivity type doped differently than the first conductivity type of the first semiconductor material of the first nanowire and forming a junction crossing region with the first nanowire and the intrinsic layer, wherein the first nanowire, the intrinsic layer, and the second nanowire form an avalanche photodiode (APD) in the junction crossing region to enable single photon detection.

2. The method of claim 1, wherein forming the first nanowire comprises depositing along the substrate in a given direction a plurality nanometer beads of a given width and length relative to each other to connect the plurality of nanometer beads to form the first nanowire.

3. The method of claim 1, wherein depositing comprises one of metal organic chemical vapor deposition (MOVCD) and molecular beam epitaxy (MBE).

4. The method of claim 2, wherein forming the second nanowire comprises depositing along a length of the first nanowire a plurality nanometer beads of a given width and length relative to each other to connect the plurality of nanometer beads to form the second nanowire.

5. The method of claim 1, further comprising forming a Bragg mirror over the substrate material to increase detector sensitivity.

6. The method of claim 1, wherein at least one of the first or second semiconductor materials is Silicon (Si) and at least one of the first or second semiconductor materials is selected from a group consisting of: Ge, InGaAs, $InGaAs_xP_{1-x}$, CdS, CdSe ZnS, and ZnSe to enable photon detection in the near infrared wavelength range, wherein x is a number greater than or equal to zero and where (Ge) is Germanium, (In) is Indium, (Ga) is Gallium, (As) is Arsenic, (P) is Phosphorus, (Cd) is Cadmium, (Se) is Selenium, (Zn) is Zinc, and (S) is Sulfur.

7. The method of claim 1, wherein at least one of the first or second semiconductor materials is Si and at least one of the first or second semiconductor materials is selected from a group consisting of: PbS, PbSe, InSb, GaSb, CdS, CdSe, HgCdSe, HgCdS, and HgCdTe to enable photon detection in the medium or long infrared wavelength range where (Pb) is Lead, (Sb) is Antimony, (Hg) is Mercury, (S) is sulfur, (Se) is Selenium, (In) is Indium, (Ga) is Gallium, (Cd) is Cadmium, and (Te) is Tellurium.

8. The method of claim 1, wherein at least one of the first or second semiconductor materials is Si and at least one of the first or second semiconductor materials is selected from a group consisting of: $PbSe_xS_{1-x}$, $Cd_xHg_{1-x}S$, $Pb_xHg_{1-x}S$, $CdSe_xS_{1-x}$, $As_2S_xSe_{5-x}$, $GeSe_xS_yTe_{(1-x-y)}$, $CuAlS_{2-x}Se_x$, $As_xSe_{1-x}Ge_5$, $AgGaSe_2$—$GeSe_2$, and $AgGaS_2$—$GeS_2$ to enable tunable wavelength characteristics, wherein x and y are numbers greater than or equal to zero and where (Cu) is Copper, (Al) is Aluminum, (As) is Arsenic, (Ge) is Germanium, (Pb) is Lead, (S) is sulfur, (Se) is Selenium, (In) is Indium, (Ga) is Gallium, (Cd) is Cadmium, (Sb) is Antimony, (Hg) is Mercury and (Ag) is Silver.

9. The method of claim 1, wherein at least one of the first and second nanowires is fabricated at about 2 to 100 nanometers in diameter and 5 to 250 nanometers in length.

* * * * *